United States Patent
Said El-Barbari et al.

(10) Patent No.: US 8,194,375 B2
(45) Date of Patent: Jun. 5, 2012

(54) OPEN CIRCUIT VOLTAGE PROTECTION SYSTEM AND METHOD

(75) Inventors: Said Farouk Said El-Barbari, Freising (DE); Robert Roesner, Unterfoehring (DE); Jie Shen, Bayern (DE)

(73) Assignee: General Electric Company, Niskayuna, NY (US)

( * ) Notice: Subject to any disclaimer, the term of this patent is extended or adjusted under 35 U.S.C. 154(b) by 335 days.

(21) Appl. No.: 12/689,410

(22) Filed: Jan. 19, 2010

(65) Prior Publication Data

US 2011/0175662 A1 Jul. 21, 2011

(51) Int. Cl.
*H02H 3/20* (2006.01)
(52) U.S. Cl. ...................................... 361/91.1
(58) Field of Classification Search ................... 361/91.1
See application file for complete search history.

(56) References Cited

U.S. PATENT DOCUMENTS

| | | | | |
|---|---|---|---|---|
| 4,873,480 A | * | 10/1989 | Lafferty | 323/299 |
| 7,158,395 B2 | | 1/2007 | Deng et al. | |
| 7,502,241 B2 | | 3/2009 | Taylor | |
| 2009/0078300 A1 | * | 3/2009 | Ang et al. | 136/244 |
| 2009/0207543 A1 | * | 8/2009 | Boniface et al. | 361/86 |
| 2010/0275966 A1 | * | 11/2010 | Folts et al. | 136/244 |
| 2010/0327659 A1 | * | 12/2010 | Lisi et al. | 307/82 |
| 2011/0018353 A1 | * | 1/2011 | Yu | 307/82 |
| 2011/0203635 A1 | * | 8/2011 | Beck | 136/244 |
| 2011/0210612 A1 | * | 9/2011 | Leutwein | 307/80 |

* cited by examiner

*Primary Examiner* — Ronald W Leja
(74) *Attorney, Agent, or Firm* — Ann M. Agosti

(57) ABSTRACT

A method to clamp an open circuit voltage in a photovoltaic module is proposed. The method include coupling a load resistor across an inverter module, initiating the inverter module and loading the inverter module via the load resistor, and coupling the loaded inverter module to the photovoltaic module. The method further include dissipating power via the load resistor to clamp the open circuit voltage of the photovoltaic module, synchronizing an output voltage of the inverter module with a voltage of a grid and then coupling the inverter module to the grid and de-coupling the load resistor across the inverter module.

15 Claims, 5 Drawing Sheets

OPEN CIRCUIT VOLTAGE PROTECTION SYSTEM AND METHOD

BACKGROUND

The subject matter disclosed herein relates generally to clamping high voltages and more particularly to clamping voltages across photovoltaic arrays.

A photovoltaic cell converts solar energy into electrical energy which is sent to one or more power converters. Certain challenges are encountered with photovoltaic energy generation that are not present in conventional energy generation systems. Examples include high voltage output during cold start conditions, IV droop characteristics of photovoltaic cells, and relatively low energy density (efficiency) of photovoltaic cells.

At low temperatures (such as below about −10° C., for example) the open circuit voltage of a photovoltaic cell can be high enough that the inverter is damaged during cold start operations. One approach to clamp high open circuit voltage during a cold start includes coupling a break chopper at the input of the inverter terminals and including a resistor. However, this approach involves significant expense because the chopper circuitry and the resistor must be able to operate under high voltages. Another approach includes shutting down the inverter at low temperatures and results in loss of power to the grid.

There is a need for an efficient and cost effective approach to allow starting of photovoltaic modules under cold operating conditions without damage occurring from open circuit voltages.

BRIEF DESCRIPTION

Briefly, a method to clamp an open circuit voltage in a photovoltaic module is proposed. The method include coupling a load resistor across an inverter module, initiating the inverter module and loading the inverter module via the load resistor, and coupling the loaded inverter module to the photovoltaic module. The method further include dissipating power via the load resistor to clamp the open circuit voltage of the photovoltaic module, synchronizing an output voltage of the inverter module with a voltage of a grid and then coupling the inverter module to the grid, and de-coupling the load resistor across the inverter module.

In another embodiment, a system to clamp an open circuit voltage across a photovoltaic module is presented. The system includes a load resistor and a first switch coupled across an output of an inverter module and a second switch coupled between the inverter module and the photovoltaic module. A third switch is coupled between the inverter module and a grid. A processor is coupled to the system and configured to control the switches, synchronize voltages, and control the inverter module. The load resistor is configured to clamp the open circuit voltage of the photovoltaic module in response to control signals from the processor.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

It will be readily understood that the components of the embodiments as generally described and illustrated in the Figures herein could be arranged and designed in a wide variety of different configurations. Thus, the following more detailed description of various embodiments, as represented in the Figures, is not intended to limit the scope of the invention, as claimed, but is merely representative of various embodiments. While the various aspects of the embodiments are presented in drawings, the drawings are not necessarily drawn to scale unless specifically indicated.

The phrases "connected to," "coupled to," and "in communication with" refer to any form of interaction between two or more entities, including mechanical, electrical, magnetic, electromagnetic, fluid, and thermal interaction. Two components may be coupled to each other even though they are not in direct contact with each other.

Distributed power generators are usually small, modular electricity generators sited close to customer loads. Such distributed power generators offer advantages that typical large-scale, capital-intensive, central-station power plants and distribution systems may not provide. Distributed power generation technologies use a variety of fuels including natural gas, diesel, biomass-derived fuels, fuel oil, propane, and hydrogen. Fuel sources are also often based on renewable energy sources such as photovoltaic, wind, and hydro sources, thereby reducing the environmental impact of a distributed power generation system. By using smaller, more fuel-flexible systems near the energy consumer, distributed generation avoids transmission and distribution power losses and provides a wider choice of energy systems to the customer. Distributed power generation typically offers reliable, cost-effective, high-quality power during peak demand periods and can be a viable alternative to central station generated power. Also, many distributed power systems produce such low noise and emissions that they can be located near the buildings or infrastructure where power is needed, thereby simplifying the problems of conventional distribution infrastructure development.

Characteristic power transmission and distribution grids transmit electrical energy from generating facilities to end-users. Multiple distributed generation systems may be interconnected to form an electrical grid. It may be noted that the electrical grid may include conventional generation and distribution networks as well. The resources of distributed generation systems may be brought on-line to supplement the electrical grid either at the utility's behest or by an owner of the generated power in an effort to sell electricity.

Figure 1:
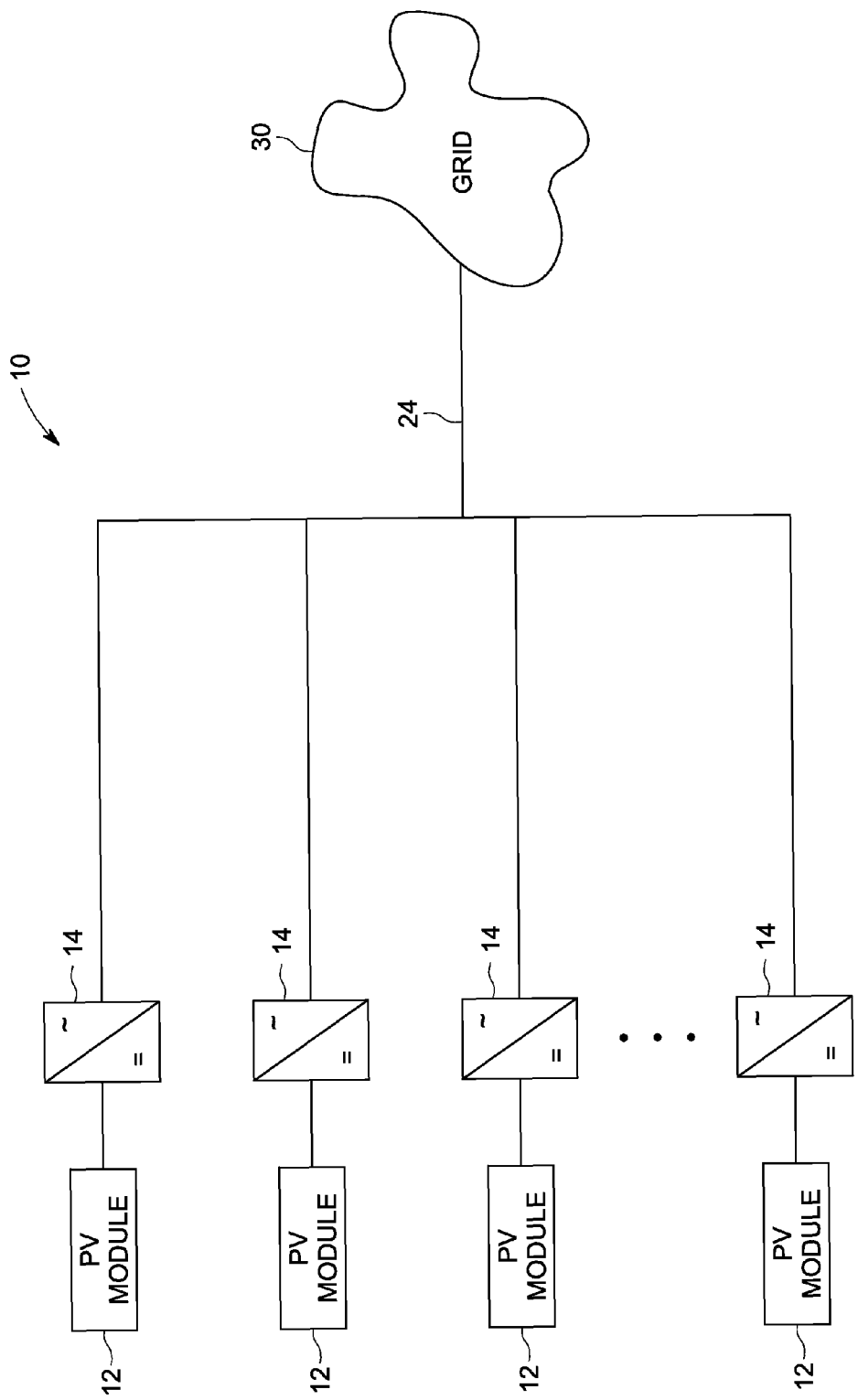
FIG. 1 illustrates one embodiment of a distributed solar power generation system according to an aspect of the invention.

Photovoltaic modules typically include multiple photovoltaic arrays and interconnected assemblies of photovoltaic cells. Since photovoltaic cells typically require protection from the environment, multiple photovoltaic cells are connected and packaged in a single module. Many such modules are often coupled to operate as one power generation unit. A photovoltaic installation typically includes an array of photovoltaic modules, inverters, batteries, and interconnection wiring. FIG. 1 illustrates one embodiment of a distributed solar power generation system that may be used with embodiments of the present invention that are disclosed herein. The distributed solar power generation system (hereafter referred to as "DSPGS") as represented by reference numeral 10 includes multiple photovoltaic modules 12, with each photovoltaic module coupled to at least one or more inverters 14 and 16.

In an exemplary embodiment, the inverters 14 are coupled together to form one phase of the DSPGS. In the illustrated embodiment, the inverters 14 are coupled together to form a first phase, a second phase, and a third phase. Three such phases having connections may be coupled together at node 24. In turn, the DSPGS 10 is coupled to a utility or a conventional grid indicated by reference numeral 30.

Each photovoltaic module 12 in DSPGS in 10 may include one or more cold start protection systems implemented according to an embodiment of the invention as discussed in detail below.

Figure 2:
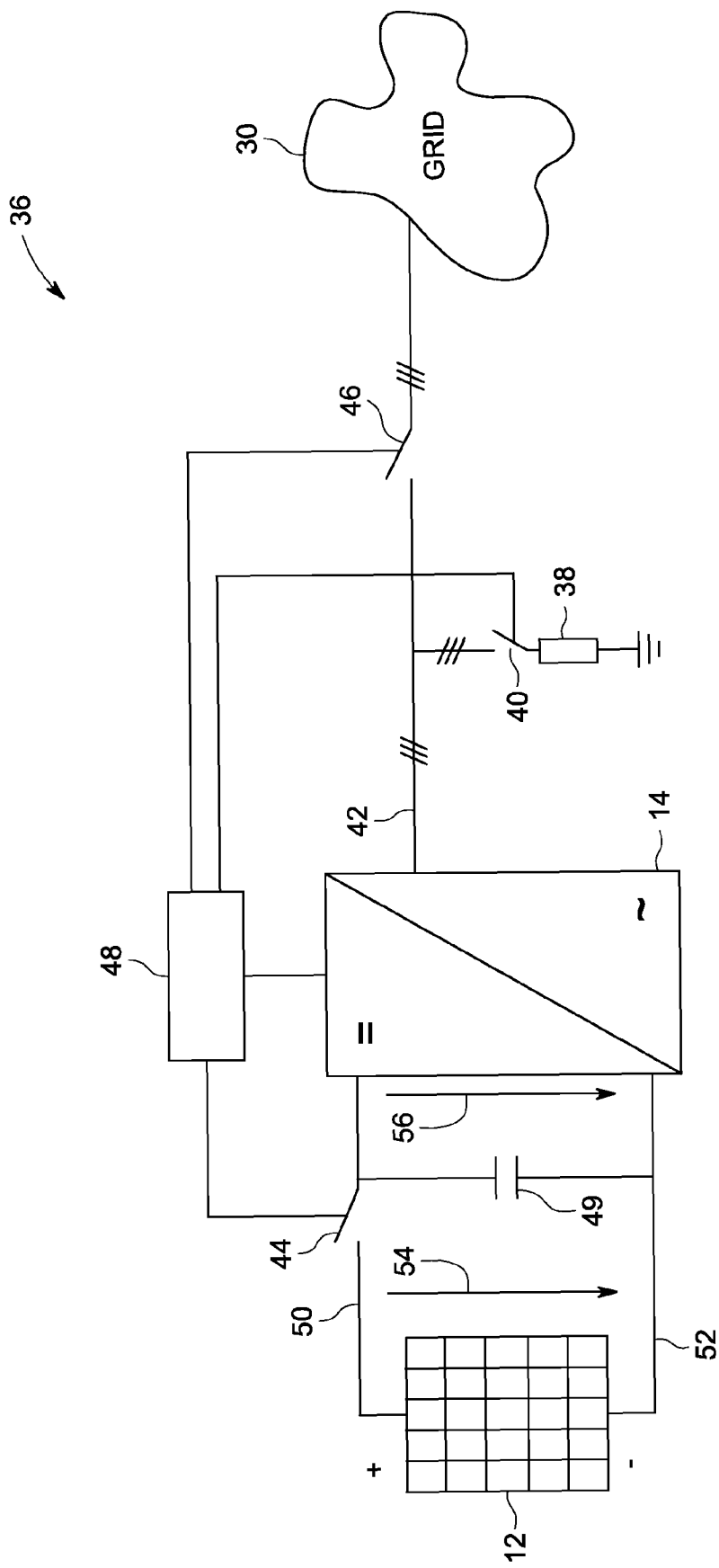
FIG. 2 illustrates an exemplary system to clamp an open circuit voltage of the photovoltaic module of FIG. 1.

FIG. 2 illustrates an exemplary system 36 to clamp an open circuit voltage of the photovoltaic module. The system 36 includes photovoltaic module 12 and inverter 14 with a load resistor 38 and a first switch 40 coupled across an output 42 of the inverter module 14. A second switch 44 is coupled between the inverter module 14 and the photovoltaic module 12, a DC link capacitor 49 is coupled across the photovoltaic module 12, and a third switch 46 is coupled between the inverter module 14 and the grid 30. In one embodiment, a voltage sensor is coupled at terminals 50, 52 to measure the open circuit voltage 54. A processor 48 is coupled to the switches (40, 44, 46) and the inverter 14 and configured to control the switches (40, 44, 46), synchronize voltages, and control the inverter module 14. The load resistor 38 is configured to clamp the open circuit voltage of the photovoltaic module to be within a safe and acceptable range for the inverter module input voltage in response to control signals from the processor 48.

In an exemplary embodiment, the system 36 is controlled by signals from the processor 48 in a sequential manner. The photovoltaic module 12 may produce high voltage at terminals 50, 52 during a cold start, for example, when the ambient temperature is at or below $-10°$ C. As discussed above, if the photovoltaic module 12 were to be coupled to the inverter 14 under high voltage conditions, the components within the inverter 14 may be damaged. To avoid such damage, certain embodiments of the invention are designed to clamp the open circuit voltage (54) of the photovoltaic module 12 at the terminals 50, 52. For example, in one embodiment, before the inverter 14 is put into operation, the processor 48 issues a command to close the first switch 40 and couple the load resistor 38 across the output terminals 42 of the inverter 14. The control scheme for the inverter module 14 in one embodiment comprises an open loop control configuration including space vector modulation or sinusoidal pulse width modulation.

The loaded inverter 14 may then be coupled to the photovoltaic module 12 by closing the second switch 44. By coupling the loaded inverter across the photovoltaic module 12, excess power is transferred to the load resistor 38 and the open circuit voltage 54 at terminals 50, 52 is clamped to an acceptable level as seen by the input voltage 56 of the inverter 14. By coupling the loaded inverter across the photovoltaic module, the maximum power point tracking algorithm may switch to zero power point towards open circuit voltage.

By design, the maximum voltage at terminals 54, 56 at the time of coupling (or immediately after coupling) the inverter 14 and the photovoltaic module 12 is limited to safe limits that are manageable by the inverter 14. The output voltage 58 of the loaded inverter 14 is synchronized with a voltage on the grid 30 before coupling of the inverter 14 and the grid 30 via the third switch 46. Once the inverter 14 and the photovoltaic module 12 are coupled to the grid, an alternate control scheme such as, for example, a closed loop configuration is implemented for the inverter 14 and then first switch 40 is opened to de-couple the load resistor 38 from the inverter 14.

Figure 3:
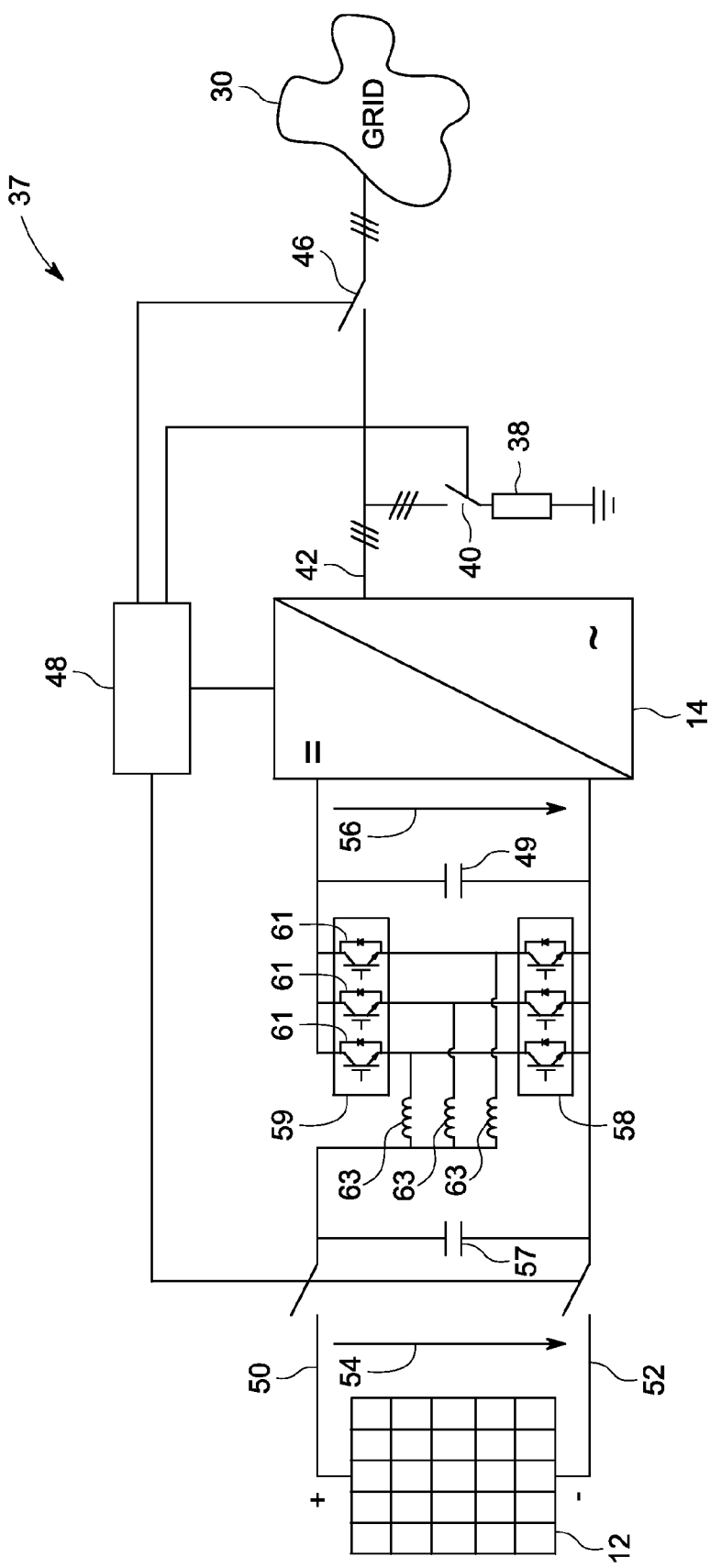
FIG. 3 illustrates another exemplary system to clamp an open circuit voltage of the photovoltaic module of FIG. 1.

FIG. 3 illustrates an alternate embodiment of a photovoltaic module coupled to the grid via boost converters and an inverter. The system 37 includes at least two boost converters 58, 59 coupled between the photovoltaic module 12 and the inverter 14. The system further includes a DC array capacitor 57 coupled across the input of boost converters. The circuit configuration of the DC link capacitor 49 and the inverter 14 up to the grid 30 are similar to the system 36 as described with respect to FIG. 2.

Initially, in an event of a cold start, the photovoltaic module 12 may produce high open circuit voltages 54 that may damage the inverter module when coupled directly without protection. In an exemplary embodiment, the system 37 is controlled by signals from the processor 48 in a sequential manner to prevent high open circuit voltage from damaging the inverter. The initial conditions include the switches 40, 44, 46 being turned off and the capacitors 49, 57 being in discharge condition. Before coupling the photovoltaic module 12 to the inverter 14, the processor 48 issues a command to close the first switch 40 to couple the load resistor 38 across the output terminals 42 of the inverter 14. Under such loaded inverter condition, a first control method such as an open loop control method is implemented by the processor 48 to turn on the inverter 14. There is no power flow to the load resistor 38 as the voltage across the DC link capacitor 49 is zero. At this instance, the processor 48 is programmed to close the second switch 44 to charge the capacitors 49 and 57. DC link capacitor 49 is charged by the current flowing through the freewheeling diode 61 and the line inductors 63. The voltage across the capacitors 49 and 57 will never reach the open circuit voltage of the photovoltaic module 12 as the inverter 14 is in loaded condition thus clamping the open circuit voltage to acceptable limits. Next another control method such as a voltage control method is implemented to control the inverter 14 by controlling the voltage across the load resistor 38. The output voltage 58 of the loaded inverter 14 is synchronized with a voltage on the grid 30 before coupling of the inverter 14 and the grid 30 via the third switch 46. Then a second control method, such as a current control method, is implemented to control the inverter 14 before turning off the first switch 40 to de-couple the load resistor 38. The boost converter 59 is operated under unity duty cycle (with boost converter 58 turned off) in case of high voltages from the photovoltaic module 12. However, in case the photovoltaic modules 12 produce lower voltages, the boost converter 58 may be turned on to compensate for the drop in input voltage for the inverter 14.

Figure 4:
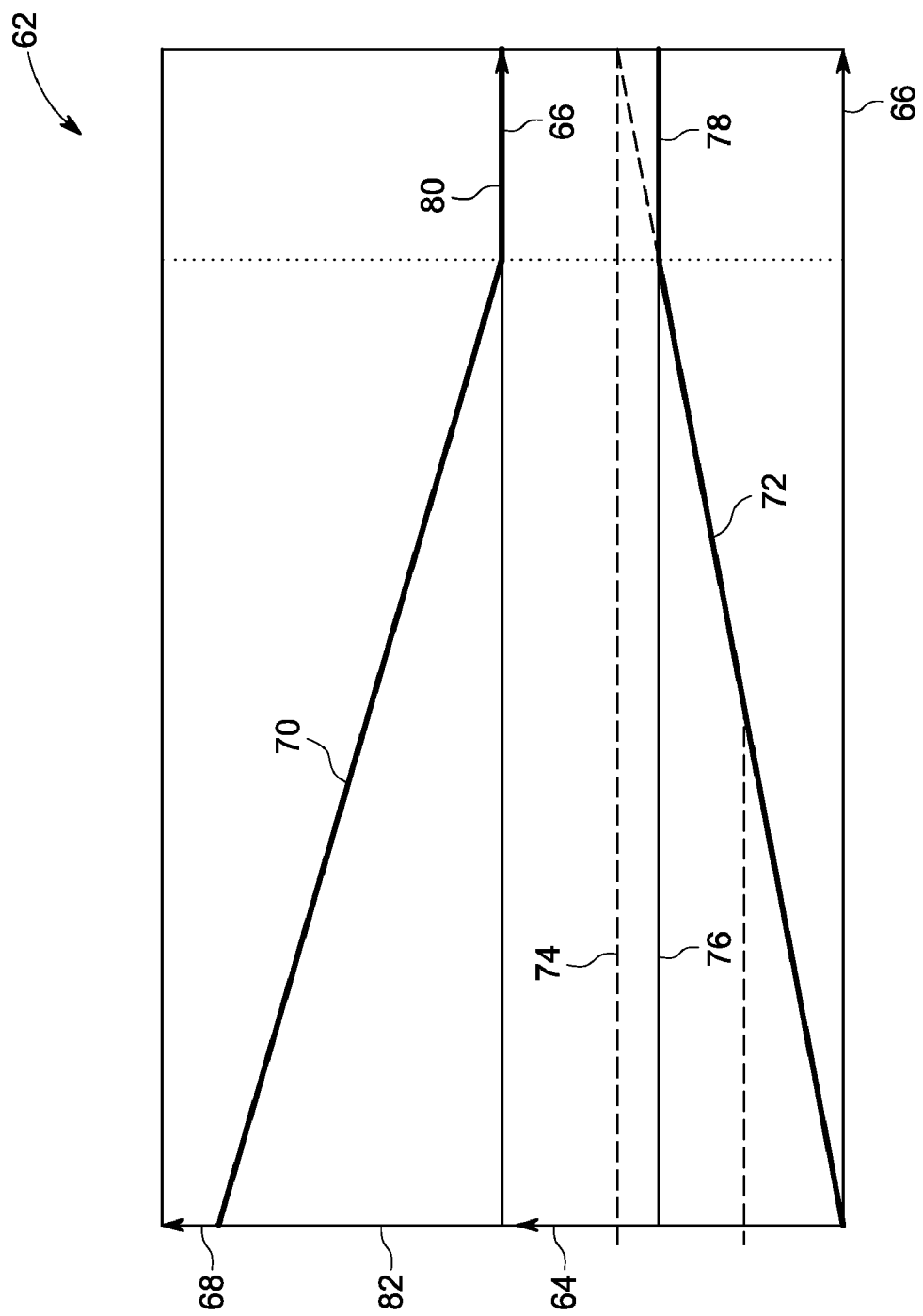
FIG. 4 illustrates current and voltage profiles during an exemplary operation of the system of FIG. 3.

FIG. 4 illustrates simulated current and voltage profiles during an exemplary operation of the system 37 of FIG. 3. The graph 62 includes time on the abscissa axis 66 and voltage & current magnitude on the ordinate axis 64, 68. The voltage and current profiles are at the capacitors 49 and 57 as referenced in FIG. 2 and FIG. 3 respectively. Profile 70 illustrates a variation of current magnitude from the instance (82) the second switch 44 (as referenced in FIG. 2 and FIG. 3) is turned on up to a steady state 80. Similarly, the profile 72 illustrates a variation of voltage magnitude from the instance (82) the second switch 44 (as referenced in FIG. 2 and FIG. 3) is turned on up to a steady state 78. The horizontal limit line 74 indicates the open circuit voltage and line 76 indicates the maximum voltage across the capacitors 49 or 57.

At an instance 82 when the second switch 44 is turned on, the current (70) across the capacitors 49 or 57 starts to decrease and the voltage (72) starts to increase. However, the maximum voltage raise across the DC array capacitor 49 or 57 is limited to a value (78) lesser than the open circuit voltage 74, thereby clamping the inverter input voltage to safer limits.

Figure 5:
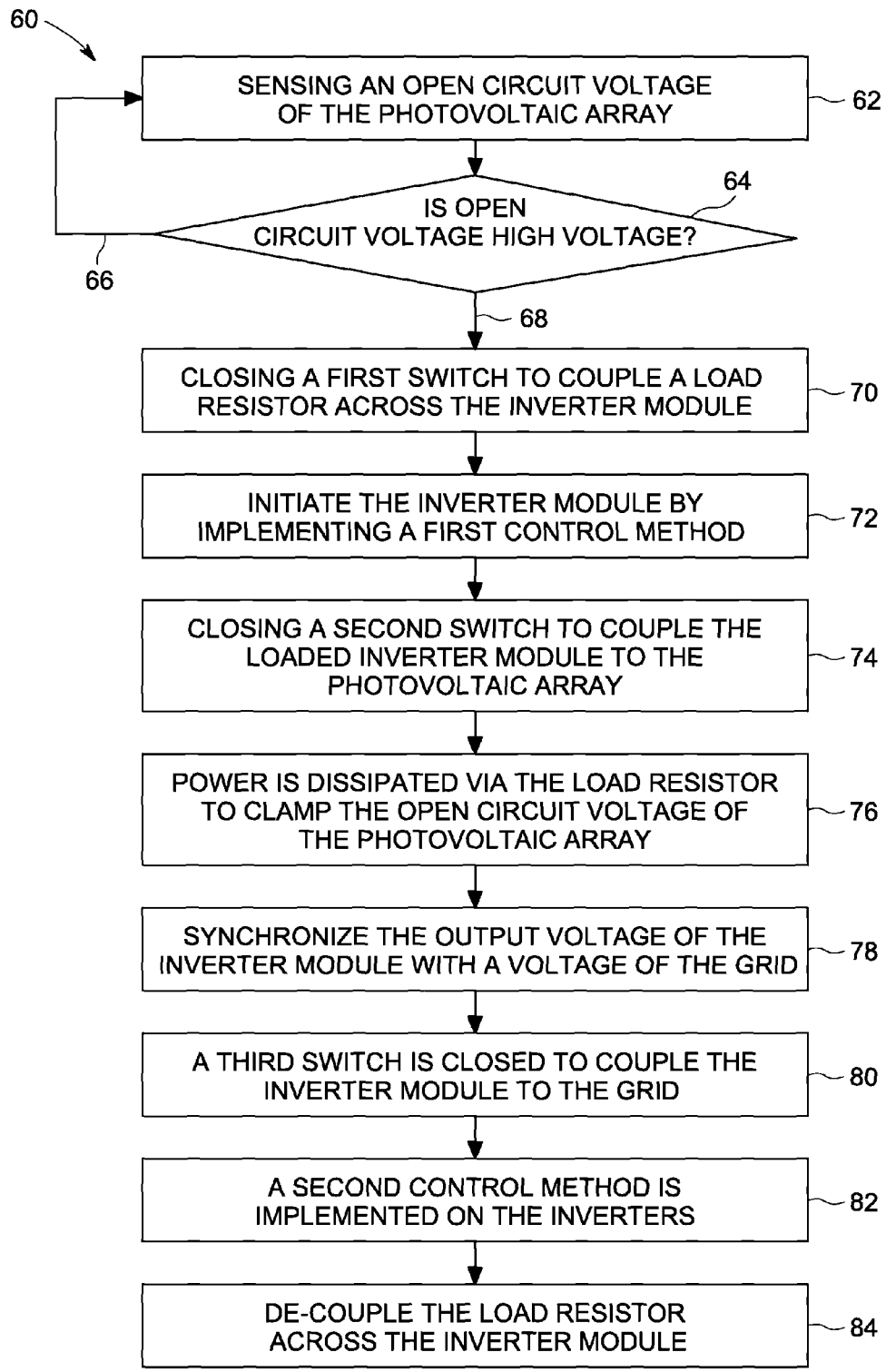
FIG. 5 illustrates an exemplary method of clamping the open circuit voltage across the photovoltaic module.

FIG. 5 illustrates an exemplary method of clamping the open circuit voltage across the photovoltaic module. In one embodiment, the exemplary method 90 may be implemented in the system 36 via the processor 48 of FIG. 2. The method 90 includes sensing an open circuit voltage of the photovoltaic module in step 92. A decision loop is implemented that includes checking if the open circuit voltage is high at step 94. If the voltage is not high voltage, the loop is reverted via 96 to sense open circuit voltage. Else, if the open circuit voltage is high, the decision step leads to (via 98) implementing series of steps 100-114 to clamp the high voltage according to an embodiment of the invention. Alternatively, if temperature conditions are cold enough, steps 92 and 94 may be omitted with the process starting at step 100. The clamping steps 100-114 include closing a first switch to couple a load resistor across the inverter module at step 100. The inverter module is initiated by implementing a first control method and loading the inverter module via the load resistor at step 102. A second switch is closed to couple the loaded inverter module to the photovoltaic module at step 104. Power is dissipated via the load resistor to clamp the open circuit voltage of the photovoltaic module at step 106. An output voltage of the inverter module is synchronized with a voltage of the grid in step 108. A third switch is closed to couple the inverter module to the grid at step 110. A second control method is implemented on the inverter at step 112. The load resistor is then de-coupled across the inverter module at step 114.

Advantageously, the embodiments disclosed herein enables generating power and synchronization with the grid and avoid shut down at low temperatures and enables minimal down time even during could days. The embodiments further implements cost effective solution and can be easily retrofit into presently operational systems. Embodiments disclosed herein are simple add on at the AC side and can be included along with software update to presently operational systems.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method to clamp an open circuit voltage in a photovoltaic module, the method comprising:
   (a) coupling a load resistor across an inverter module;
   (b) initiating the inverter module and loading the inverter module via the load resistor;
   (c) coupling the loaded inverter module to the photovoltaic module;
   (d) dissipating power via the load resistor to clamp the open circuit voltage of the photovoltaic module;
   (e) synchronizing an output voltage of the inverter module with a voltage of a grid and then coupling the inverter module to the grid; and
   (f) de-coupling the load resistor across the inverter module.

2. The method of claim 1, wherein initiating the inverter module comprises controlling on and off statuses of switches of the inverter module.

3. The method of claim 2, wherein controlling the on and off statuses of the switches comprises using at least one of a space vector modulation or a pulse width modulation.

4. The method of claim 1, wherein clamping the open circuit voltage comprises limiting the open circuit voltage of the photovoltaic module to be within a safe and acceptable range of input voltage of the inverter module.

5. The method of claim 1 further comprising implementing a closed loop inverter control after coupling the inverter module to the grid and before de-coupling the load resistor.

6. The method of claim 1 further comprising sensing a voltage across the photovoltaic module to detect the open circuit voltage.

7. A system to clamp an open circuit voltage across a photovoltaic module, the system comprising:
   a load resistor and a first switch across an output of an inverter module;
   a second switch between the inverter module and the photovoltaic module;
   a third switch between the inverter module and a grid; and
   a processor to control the first, second, and third switches and inverter switches of the inverter module,
   wherein the load resistor is configured to clamp the open circuit voltage of the photovoltaic module in response to control signals from the processor.

8. The system of claim 7, wherein the first switch is configured to couple the load resistor or de-couple the load resistor across the inverter module.

9. The system of claim 7, wherein the second switch, upon activation, is configured to stabilize the voltage across the inverter module and the photovoltaic module.

10. The system of claim 7, wherein the processor is configured to send a control signal to activate the third switch after an output voltage of the inverter module is synchronized with a grid voltage.

11. The system of claim 10, wherein the processor is further configured to sense and compare the open circuit voltage, the output voltage of the inverter module, and the grid voltage.

12. The system of claim 7, wherein the processor is configured to send control signals to operate the switches such that the load resistor loads the inverter module prior to the inverter module being coupled to the photovoltaic module.

13. The system of claim 12, wherein the loaded inverter module is configured to clamp the open circuit voltage of the photovoltaic module.

14. The system of claim 7 further comprising a voltage sensor coupled to the photovoltaic module for obtaining a voltage signal for use in detecting the open circuit voltage.

15. The system of claim 7 further comprising at least one boost converter coupled between the inverter module and the photovoltaic module.

* * * * *